United States Patent [19]
Wada

[11] Patent Number: 5,371,384
[45] Date of Patent: Dec. 6, 1994

[54] SOLID STATE IMAGING DEVICE HAVING A LIGHT EMITTING DIODE

[75] Inventor: Kazushi Wada, Kanagawa, Japan
[73] Assignee: Sony Corporation, Tokyo, Japan
[21] Appl. No.: 80,709
[22] Filed: Jun. 24, 1993
[51] Int. Cl.⁵ ............... H01L 31/12; H01L 31/16; H01L 29/78
[52] U.S. Cl. .................... 257/82; 257/84; 257/93; 257/98; 257/232; 257/233
[58] Field of Search ............... 257/80, 81, 82, 84, 257/89, 91, 93, 95, 98, 232, 233, 241, 244

[56] References Cited

U.S. PATENT DOCUMENTS

| | | | |
|---|---|---|---|
| Re. 31,612 | 6/1984 | Saner | 257/238 |
| 3,750,114 | 7/1973 | Valassis | 257/225 |
| 3,806,729 | 4/1974 | Caywood | 257/229 |
| 3,849,651 | 11/1974 | Ennulat | 257/227 |
| 3,973,136 | 8/1976 | Lee | 257/215 |
| 4,879,250 | 11/1989 | Chan | 257/80 |
| 5,130,761 | 7/1992 | Tanaka | 257/98 |
| 5,266,828 | 11/1993 | Nakamura et al. | 257/432 |

FOREIGN PATENT DOCUMENTS

| | | | |
|---|---|---|---|
| 61-204989 | 9/1986 | Japan | 257/82 |
| 2-238679 | 9/1990 | Japan | 257/89 |

*Primary Examiner*—Ngan Van Ngo
*Attorney, Agent, or Firm*—Hill, Steadman & Simpson

[57] ABSTRACT

Light emitting devices are formed on a surface of a solid state imaging device and are used as illumination light sources. In a solid state imaging device for use in an electro-endoscope or the like, an illumination light source need not be provided independently of the solid state imaging device. Hence, the electro-endoscope can be miniaturized and simplified in structure.

18 Claims, 13 Drawing Sheets

F I G. 9
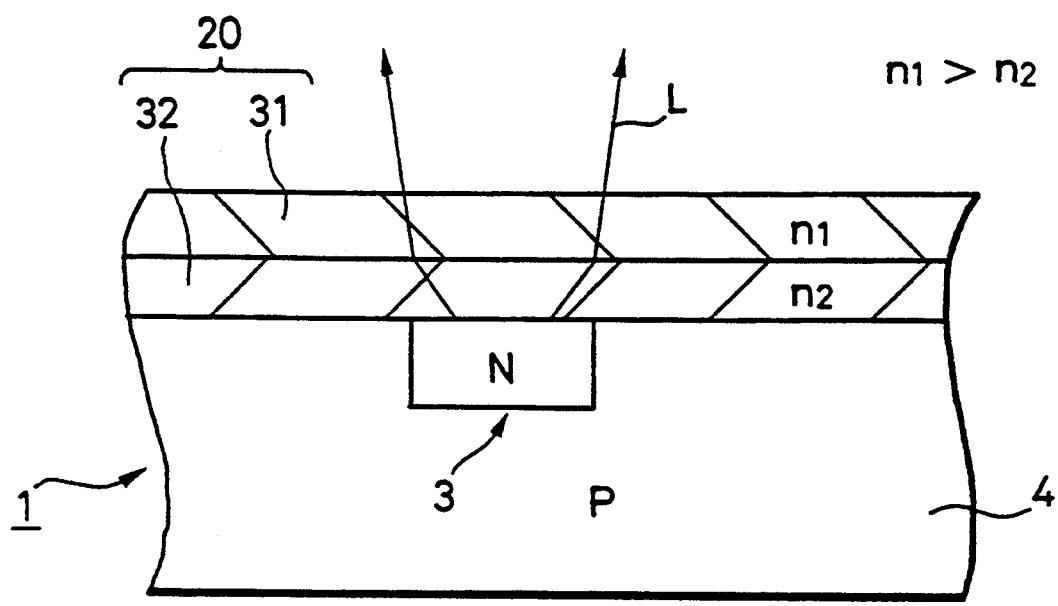
F I G. 10
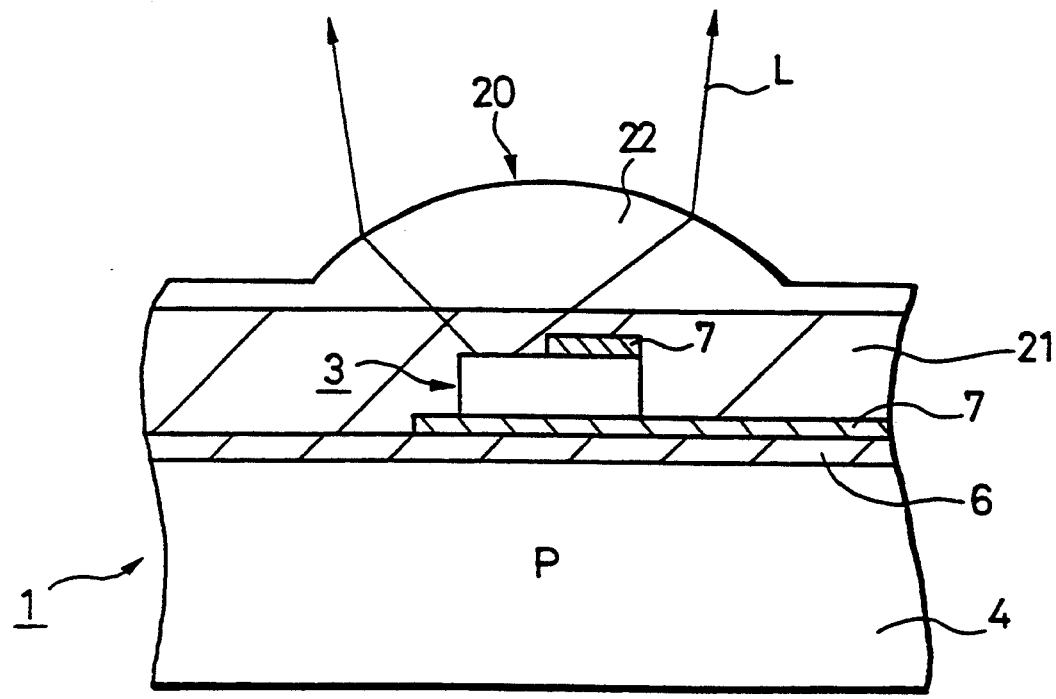

SOLID STATE IMAGING DEVICE HAVING A LIGHT EMITTING DIODE

BACKGROUND OF THE INVENTION

1. Field of the Invention

The present invention generally relates to solid state imaging devices and, more particularly, to a small solid state imaging device having a simple structure capable of picking up an image in a dark place, i.e., a solid state imaging device for use with an electro-endoscope.

2. Description of the Prior Art

FIG. 1 of the accompanying drawings shows an example of a conventional electro-endoscope in which an endoscope scope has on its top a small solid state imaging device which derives a picture in the form of an electrical signal.

As shown in FIG. 1, there are provided an endoscope scope a and a solid state imaging device b provided at a position inwardly and within an interior of the scope a. The solid state imaging device b receives a source voltage from a signal processing system 12 provided at the outside of the endoscope a and supplies an image signal to the signal processing system 12. Light guides c, c are made of optical fibers, for example, to emit a light supplied thereto from a light source 13 provided outside the endoscope a through the inside of the endoscope a from the top surface of the endoscope a.

An objective lens d is disposed ahead of the solid state imaging device b. A blast outlet e is used to clean smudges on the objective lens d by the jetting of air supplied thereto from an air and water conveyance system 14. A water conveyance outlet f is used to jet water supplied thereto from the air and water conveyance system 14. The solid state imaging device b and the signal processing system 12 are coupled via a wiring g. In FIG. 1, reference numeral 15 designates a control system and reference letters h denote a television monitor and i a recording apparatus.

Demands from users that the electro-endoscope be made as small as possible is unlimited and the manufacturers intend to produce smaller solid state imaging devices. However, such requirements of the users cannot be satisfied even when the solid state imaging device is made compact in size. The reason for this is that, although solid state imaging devices are miniaturized by the development of micro-lithography, the conventional electro-endoscope needs a light source provided separately from the solid state imaging device and therefore there is a large limit on miniaturizing the electro-endoscope.

SUMMARY OF THE INVENTION

It is an object of the present invention to provide an improved solid state imaging device in which the aforesaid shortcomings and disadvantages encountered with the prior art can be eliminated.

More specifically, it is an object of the present invention to provide a solid state imaging device which is simple in structure and small in size and which can pick up an image at a dark place.

It is another object of the present invention to provide a solid state imaging device which can be made smaller in size and in which the number of assembly steps can be reduced.

It is still another object of the present invention to provide a solid state imaging device in which an intensity of light from a light source and a color of light can be selected with increased freedom.

It is a further object of the present invention to provide a solid state imaging device in which an illumination light can be made as a light of white color or color close to the white color so that an object image can be reproduced in genuine color or color close to the genuine color.

It is a further object of the present invention to provide a solid state imaging device in which the occurrence of smear due to a light from a light emitting device can be reduced.

It is a further object of the present invention to provide a solid state imaging device in which a utilization factor of light can be improved and the occurrence of flare due to a light from a light emitting device can be avoided.

It is a yet further object of the present invention to provide a solid state imaging device in which a light directivity member can be formed with ease.

It is a still further object of the present invention to provide a solid state imaging device for use in an electro-endoscope which is simple in structure and small in size.

According to a first aspect of the present invention, there is provided a solid state imaging device which includes at least one light emitting device.

According to a second aspect of the present invention, there is provided a solid state imaging device in which a light emitting device is unitarily formed on the surface portion of a semiconductor substrate in which the solid state imaging device is formed.

According to a third aspect of the present invention, there is provided a solid state imaging device in which a light emitting device is bonded onto the surface of a semiconductor substrate in which the solid state imaging device is formed.

According to a fourth aspect of the present invention, there is provided a solid state imaging device which includes a plurality of light emitting devices which emit lights of different colors.

According to a fifth aspect of the present invention, there is provided a solid state imaging device which includes a light intercepting section for preventing a light from the light emitting device from being introduced into an image section.

According to a sixth aspect of the present invention, there is provided a solid state imaging device in which a light directivity section is formed on the surface of a light emitting device.

In accordance with a seventh aspect of the present invention, there is provided a solid state imaging device in which the light directivity member is formed of an on-chip micro-lens.

In accordance with an eighth aspect of the present invention, there is provided a solid state imaging device in which the light directivity member is formed by a combination of films having different refractive indexes.

In accordance with a ninth aspect of the present invention, there is provided a solid state imaging device which is used as an electro-endoscope.

According to the solid state imaging device of the first aspect of the present invention, since the solid state imaging device itself includes the light emitting device, such a light emitting device can be used as the light source and the light source need not be provided as the part different from the solid state imaging device. Hence, although the solid state imaging device is simple in structure and small in size, the solid state imaging device can pick up an image at a dark place.

According to the solid state imaging device of the second aspect of the present invention, since the light emitting device can be manufactured in the manufacturing process of the solid state imaging device, a process in which the solid state imaging device is assembled onto the light emitting device is not required. Hence, the solid state imaging device having the light emitting device serving as the light source can be made smaller in size and the number of assembly steps can be reduced.

According to the solid state imaging device of the third aspect of the present invention, since the light emitting device separately formed from the solid state imaging device is bonded onto the surface of the solid state imaging device, the light emitting device whose characteristics cannot be obtained when the semiconductor substrate in which the solid state imaging device is formed is used as the semiconductor substrate can be used as the light source. Hence, an intensity of light from the light source and a color of light can be selected with increased freedom.

According to the solid state imaging device of the fourth aspect of the present invention, since the solid state imaging device includes a plurality of light emitting devices which emit lights of different colors, an illumination light can be made as a light of white color or color close to the white color. Hence, an object image can be reproduced in genuine color or color close to the genuine color or color suitable for the object when the object is picked up.

According to the solid state imaging device of the fifth aspect of the present invention, since the solid state imaging device includes the light intercepting section that prevents the light from the light emitting device from being introduced into the image section, the light from the light emitting device can be prevented from being introduced into the image section and the occurrence of smear due to the light from the light emitting device can be avoided.

According to the solid state imaging device of the sixth aspect of the present invention, since the light directivity member is provided on the surface of the light emitting device, the light emitted from the light emitting device is converged forward through the light directivity member. Hence, the utilization factor of light can be improved and the occurrence of flare can be reduced.

According to the solid state imaging device of the seventh aspect of the present invention, since the light directivity member is formed of the on-chip micro-lens, such an on-chip micro-lens can be formed at the same time when the on-chip micro-lens on the image section is formed. Hence, the light directivity member can be formed with ease.

According to the solid state imaging device of the eighth aspect of the present invention, since the light directivity member is formed by the combination of films having different refractive indexes, the light directivity member can be formed with ease.

According to the solid state imaging device of the ninth aspect of the present invention, since any one of the solid state imaging devices of the first to eighth aspects is applied to the electro-endoscope, it is possible to provide a small electro-endoscope of simple structure. Furthermore, since the color of the illumination light and intensity of the illumination light are selected with increased freedom and the illumination light can be made as the light of white color or color close to the white color or color suitable for picking up the object by the combination of light emitting devices having different colors, it is possible to provide an electro-endoscope which can reproduce the object image in genuine color or color close to the genuine color.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIG. 9 is a cross-sectional view illustrative of a yet further example of formation of a light directivity member;

FIG. 10 is a cross-sectional view illustrative of a further example of formation of a light directivity member;

DETAILED DESCRIPTION OF THE PREFERRED EMBODIMENTS

Embodiments of a solid state imaging device according to the present invention will now be described in detail with reference to the drawings.

Figure 1A:
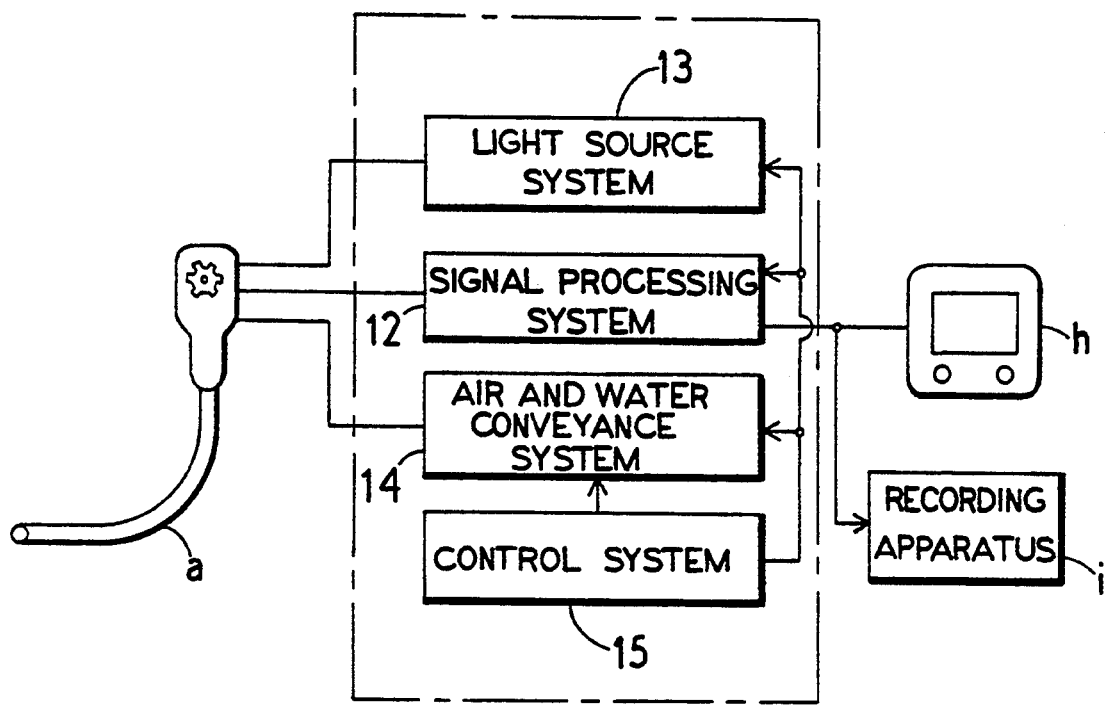
FIG. 1 is a schematic diagram showing a structure of a conventional electro-endoscope.
Figure 1B:
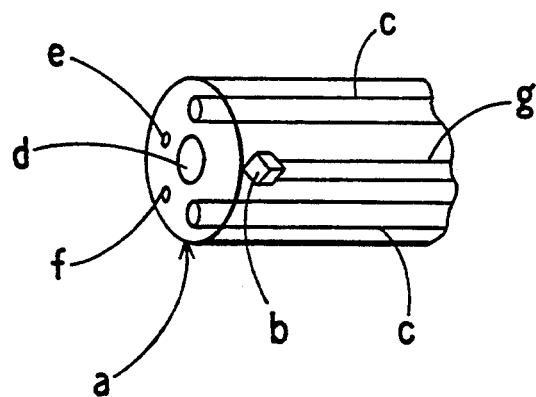
Figure 2:
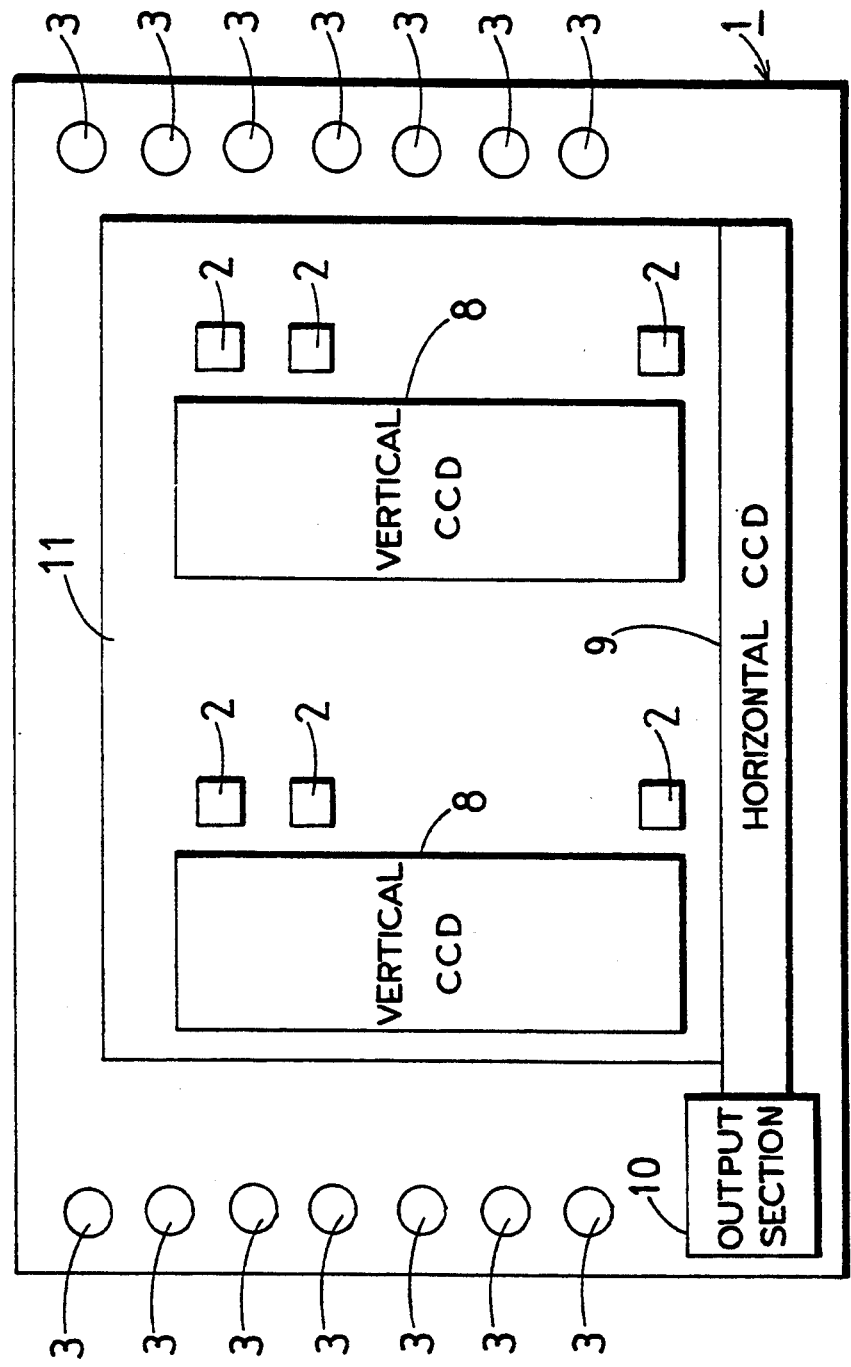
FIG. 2 is a plan view illustrative of a solid state imaging device according to an embodiment of the present invention.

FIG. 2 is a plan view illustrating a main portion of a solid state imaging device according to an embodiment of the present invention.

Referring to FIG. 2, there is provided, except at a peripheral portion a solid state imaging device 1 having an image area 11 composed of image sensors 2, 2, ..., each serving as a pixel, vertical CCDs (charge-coupled devices) 8, 8, a horizontal CCD 9 and an output section 10. Light emitting devices 3, 3, ... are provided at both sides of the image area 11.

According to the above solid state imaging device 1, the light emitting devices 3, 3, ..., are used as illumination light sources, and an object can be picked up by the image area 11 of the solid state imaging device 1 while the lights from the light emitting devices 3, 3, ..., are used as illumination light.

That is, since the solid state imaging device 1 itself includes the light emitting devices 3, 3, ..., such light emitting devices 3, 3, ..., can be used as the light sources, and the light sources need not be provided as parts different from the solid state imaging device. Therefore, although this type of solid state imaging device is simple in structure and small in size, it can pick up an image at a dark area. Furthermore, since the image area 11 and the light emitting devices 3, 3, ..., are disposed very close to each other, lights emitted from the light emitting devices 3, 3, ..., can be effectively utilized as illumination light.

Figure 3:
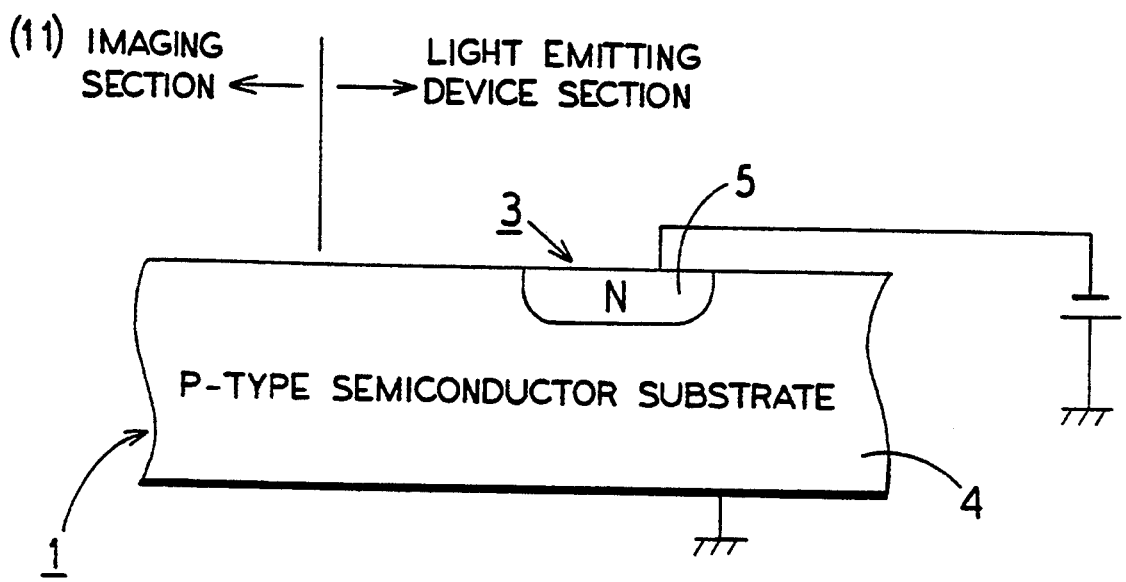
FIG. 3 is a cross-sectional view illustrative of an example that a light emitting device is formed.

FIG. 3 shows an example that the light emitting device 3 is formed. In FIG. 3, reference numeral 4 designates, for example, a P-type silicon semiconductor substrate in which the solid state imaging device 1 is formed. Reference numeral 5 denotes an N-type region which is selectively formed on the surface of the P-type silicon semiconductor substrate 4. The N-type region 5 and the semiconductor substrate 4 constitute a light emitting device (LED (light emitting diode)).

According to the above solid state imaging device, the light emitting device also can be fabricated with ease by the manufacturing process of the solid state imaging device. Therefore, the solid state imaging device can incorporate therein the light emitting devices without increasing the manufacturing steps or processes thereof.

A light emitting device that can emit a light beam of visible area had not been manufactured by using a silicon semiconductor substrate so far. Professor Koshida, the department of engineering, Tokyo University of Agriculture and Technology et. al had confirmed that a visible light can be generated by changing the property of material by forming the substrate surface as a porous substrate surface according to a chemical treatment.

More specifically, a light emitting device that generates a light (orange color) having a wavelength of 650 nm and a light emitting device that generates a light (yellow color) having a wavelength of 620 nm can be formed by utilizing the P-type semiconductor substrate. Further, it is expected that a light emitting device that emits a blue light having a wavelength of 400 nm band can be realized.

Therefore, it is sufficiently possible that the light emitting devices 3, 3, ..., are formed on the semiconductor substrate 4 of the solid state imaging device 1. Thus, the solid state imaging device 1 can incorporate therein the light emitting devices 3, 3, ..., without changing the size thereof substantially and without substantially increasing the manufacturing processes thereof.

Figure 4:
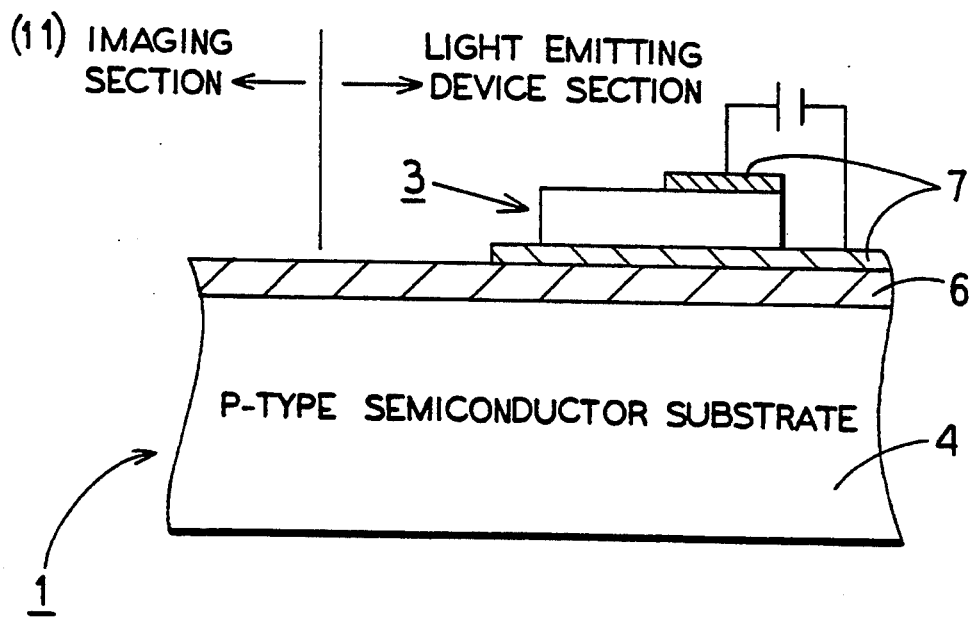
FIG. 4 is a cross-sectional view illustrative of another example that the light emitting device is formed.

FIG. 4 is a cross-sectional view illustrative of another example by which the light emitting device 3 is formed. In the solid state imaging device 1 shown in FIG. 4, the light emitting device 3 that is formed perfectly independently is bonded to the surface of the semiconductor substrate 4 via an insulating film 6. In FIG. 4, reference numerals 7, 7 denote electrodes of the light emitting device 3.

The solid state imaging device 1 shown in FIG. 4 can incorporate therein the light emitting device 3 formed on a semiconductor substrate that is made of a material which is completely different from that of the semiconductor substrate 4 in which the solid state imaging device 1 is formed. Thus, the range of the intensity of illumination light which is selected and the light which is selected can be widened.

While it becomes possible to manufacture the light emitting device that can emit a visible light by using the silicon semiconductor substrate, silicon has a band structure of an indirect transition type. According to at least the present technology, the above light emitting device is low in light emission efficiency as compared with a light emitting device formed of a GaAs compound semiconductor or the like having a direct transition band structure. Further, the previous light emitting device has a narrow range in which the color of light thus generated is selected.

However, when the light emitting device 3 is formed independently of the solid state imaging device 1, the light emitting device formed of a compound semiconductor can be utilized as the light emitting device 3. Thus, the range in which the light emission intensity of the light emitting device 3 and the color of light are selected can be prevented from being narrowed.

There can be provided a single or a plurality of light emitting devices 3. If there is provided one light emitting device 3, the color of the illumination light is limited to a color of the emitted light from one light emitting device 3.

If there are provided a plurality of light emitting devices 3, then illumination of a white color can be effected by selecting light emitting devices which emit light beams of different colors as the respective light emitting devices 3, 3, ....

Figure 5:
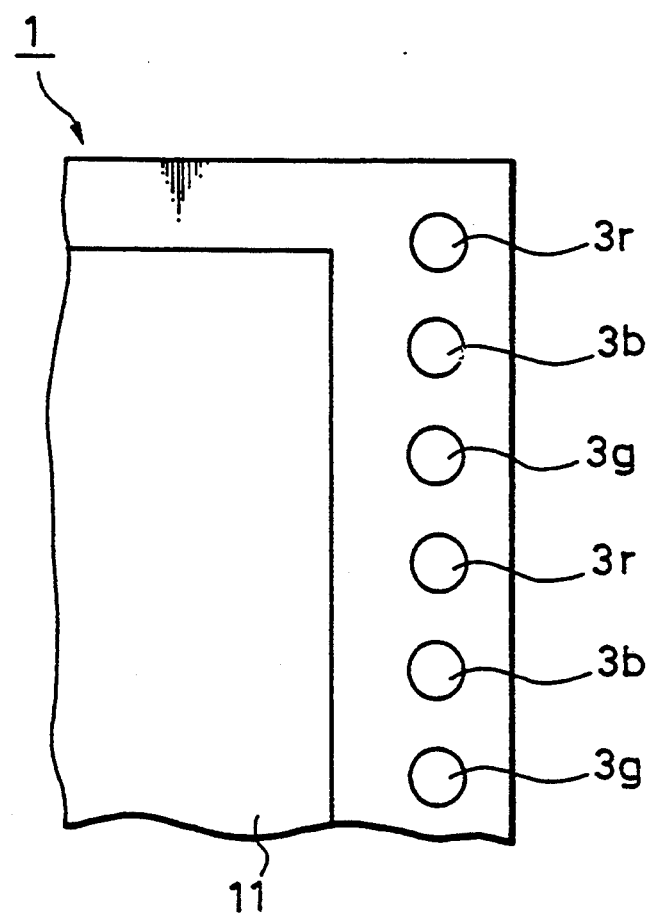
FIG. 5 is a plan view illustrative of a main portion of the solid state imaging device according to another embodiment of the present invention.

FIG. 5 shows an example of the above-mentioned modified solid state imaging device. In FIG. 5, reference numeral 3r denotes a light emitting device that emits a red light, 3b a light emitting device that emits a blue light, and 3g a light emitting device that emits a green light. Since lights of three primary colors that are mixed to provide a white light are emitted from the light emitting devices 3r, 3b and 3g, an object can be picked up with its original color and then reproduced.

Further, the colors of light beams emitted from the light emitting devices 3, 3, ..., need not always provide strictly a white light. The reason for this is that, even when an illumination light is a light approximate to a white light, then an object can be picked up and then reproduced in color close to its original color.

Further, if it is sufficient that a shape of object is picked up, then an illumination light need not be made a white light or light of a color close to the white light.

Therefore, in that case, a color of light emitting device 3 is not restricted so much. In addition, if the application of visible light is not preferred, but the application of invisible light such as infrared rays or the like is preferable when the solid state imaging device is used to pick up an object, then there may be used light emitting devices 3, 3, . . . , that emit such invisible light.

In the solid state imaging device of the present invention, light beams emitted from the light emitting devices 3, 3, . . . , (or 3r, 3b, 3g, . . . ) may be converged in front of the device.

Figure 6:
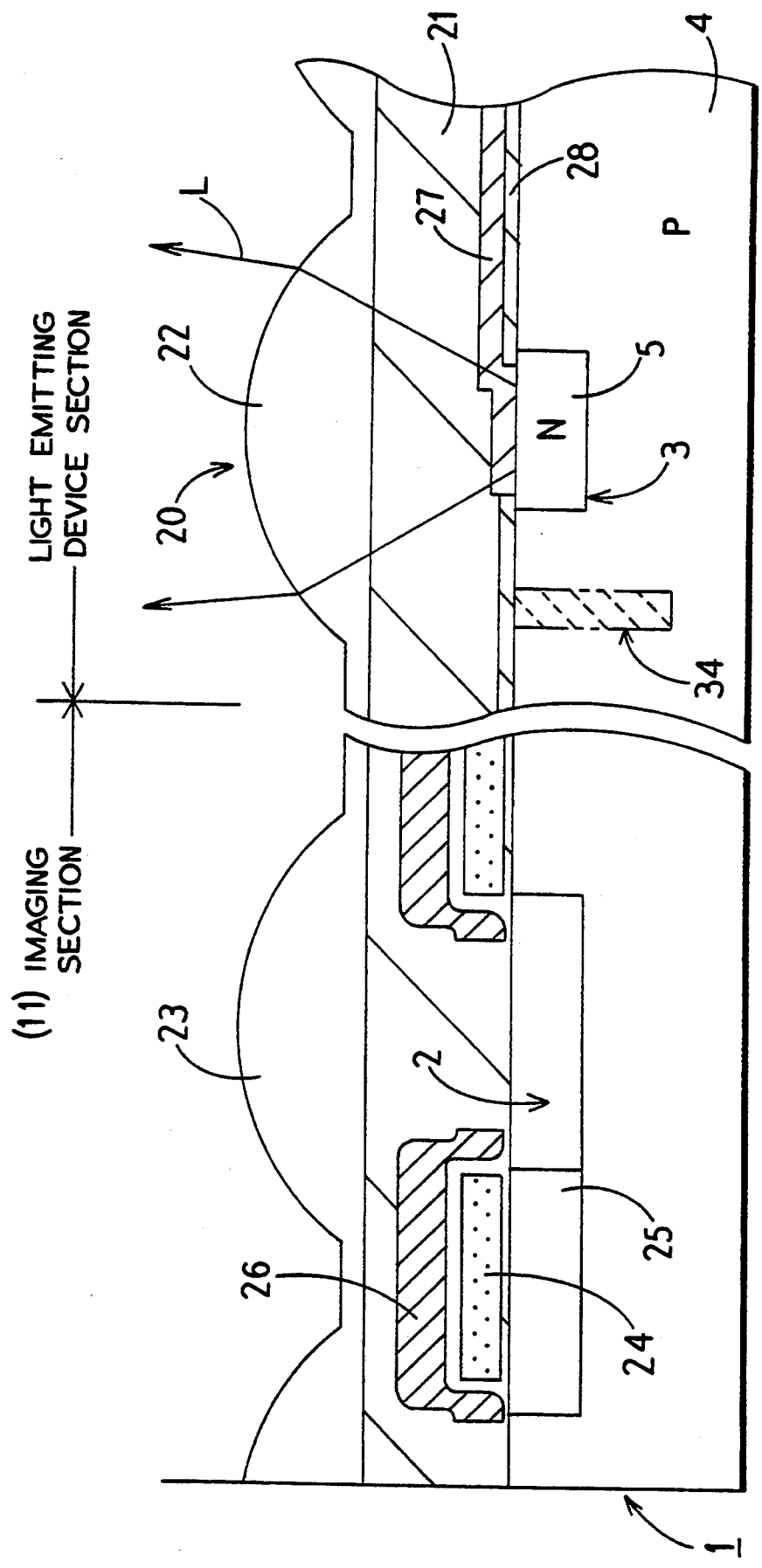
FIG. 6 is a cross-sectional view illustrative of an example wherein a light directivity member is formed.

In a solid state imaging device shown in FIG. 6, for example, an on-chip micro-lens 22 serving as a light directivity member 20 is formed on the surface of the light emitting device 3 within the semiconductor substrate 4 through a planarization film 21. The on-chip micro-lens 22 on the light emitting device 3 can be formed at the same time when an on-chip micro-lens 23 on a sensor 2 of the imaging section 11 is formed.

In FIG. 6, reference numeral 24 denotes a transfer electrode made of polycrystalline silicon of the vertical CCD 8, 25 a transfer channel region of the vertical CCD 8, and 26 an Al light intercepting layer that intercepts the vertical CCD 8. Reference numeral 27 designates one electrode of the light emitting device 3. The electrode 27 may be formed of a metal film such as Al or the like that is thin enough to pass a light therethrough or a transparent conductive film. In FIG. 6, reference numeral 28 designates an insulating film.

According to the solid state imaging device 1 shown in FIG. 6, a light L from each light emitting device 3 is converged by the on-chip micro-lens 22 and thereby emitted forward. Therefore, a utilization factor of light can be increased and a flare due to the light from the light emitting device 3 can be avoided.

Figure 7:
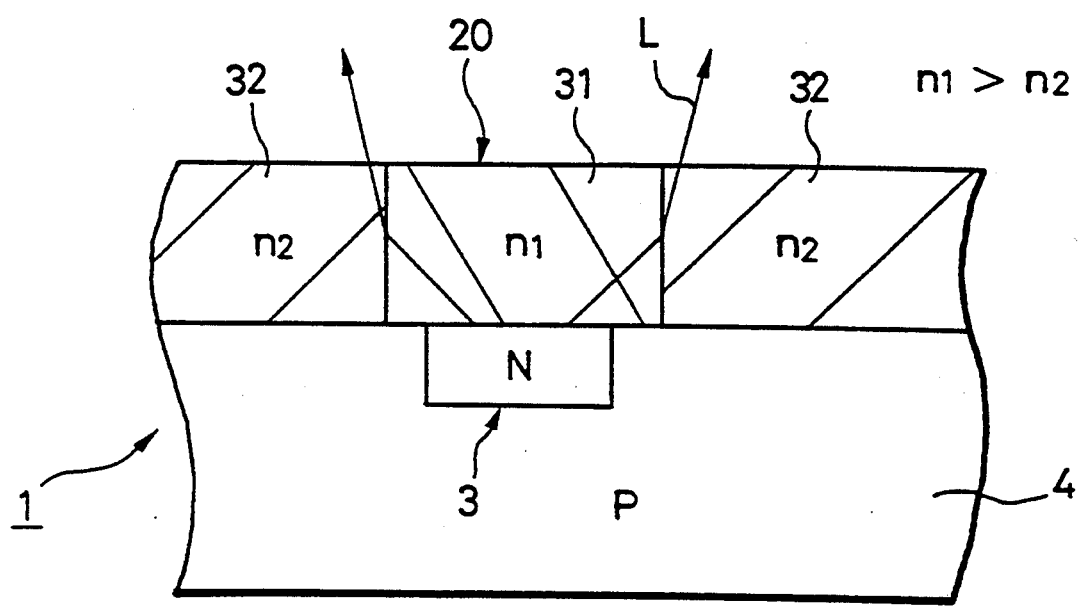
FIG. 7 is a cross-sectional view illustrative of another example wherein a light directivity member is formed.

As shown in FIG. 7, the light directivity member 20 formed on the surface of each of the light emitting devices 3 may be formed by the combination of insulating films having different refractive indexes, i.e., by forming an insulating film 31 having a large refractive index $n_1$ at the center and insulating films 32 having small refractive index $n_2$ around the insulating film 31. As the insulating film 31 having the large refractive index $n_1$, there may be employed a plasma SiN film ($n_1 = 2.0$). As the insulating film 32 having the small refractive index $n_2$, there may be employed an $SiO_2$ film ($n_2 = 1.45$). As these films 31, 32, there may be used films that are used to form the solid state imaging device. According to this structure, the light L from the light emitting device 3 can be refracted at the boundaries between the two insulating films 31, 32 and thereby converged forward.

Also, as the light directivity member 20, as shown in FIG. 9, it can be formed by commonly laminating the insulating film 32 having the small refractive index $n_2$ and the insulating film 31 having the large refractive index $n_1$ on the surface of each light emitting device 3 sequentially. Even according to this structure, the light L emitted from each light emitting device 3 is refracted through the boundary between the insulating films 32 and 31 and hence can be converged forward.

Figure 8:
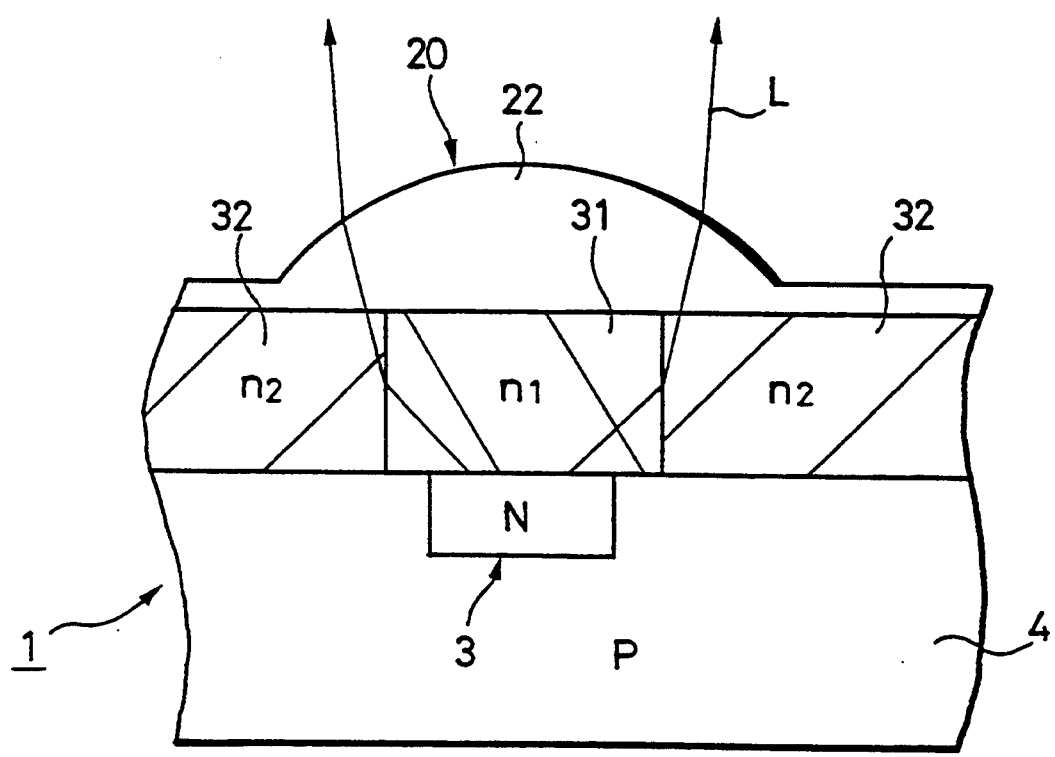
FIG. 8 is a cross-sectional view illustrative of a further example wherein a light directivity member is formed.

Further, the light directivity member 20 may be constructed by the combination of the on-chip micro-lens 22 shown in FIG. 6 and the film structure of the insulating films 31, 32 shown in FIG. 7 or 9. The light directivity member 20 shown in FIG. 8, for example, is composed of the film structure of the insulating films 31, 32 shown in FIG. 7 and the on-chip micro-lens 22 of FIG. 6 formed on the above film structure.

According to this structure, the light L from each light emitting device 3 is refracted at the boundaries between the insulating films 31 and is 32 and then converged by the on-chip micro-lens 22 so that the light L can be converged more.

FIGS. 10, 11, 12 and 13 respectively show examples of the light directivity member 20 applied to the solid state imaging device 1 in which the light emitting devices 3, 3, . . . , (or 3r, 3b, 3g, . . . , ) are formed different from the semiconductor substrate 4.

FIG. 10 shows an example of the light directivity member 20 being formed of the on-chip micro-lens 22. As shown in FIG. 10, the on-chip micro-lens 22 is formed on each light emitting device 3 through the planarization film 21.

Figure 11:
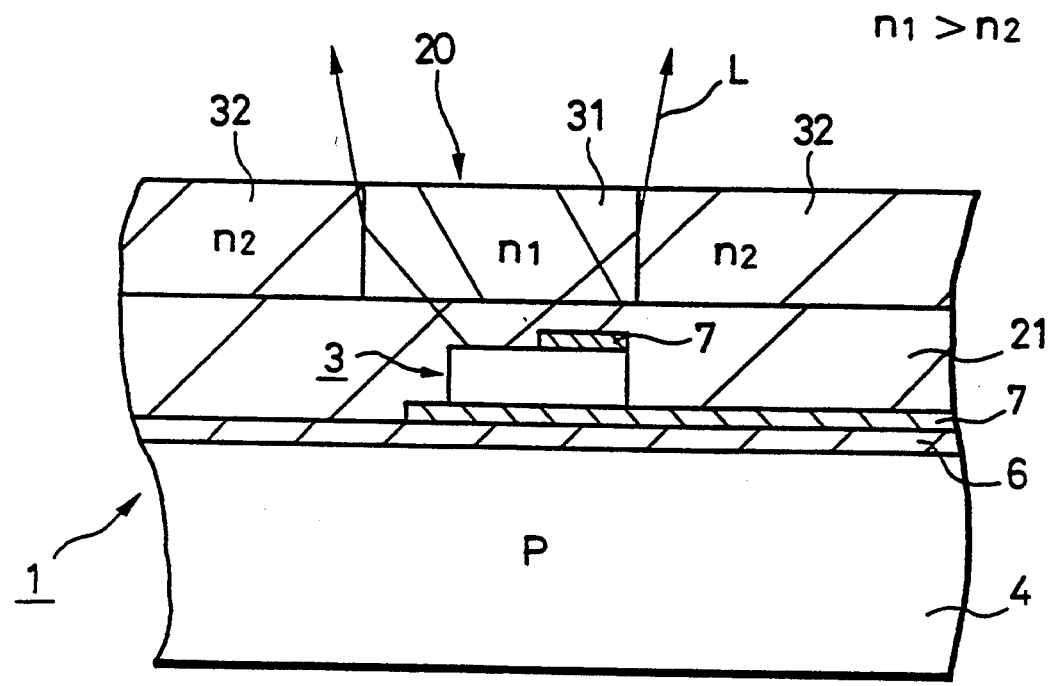
FIG. 11 is a cross-sectional view illustrative of a further example of formation of a light directivity member.

FIG. 11 shows an example of the light directivity member 20 being formed by the combination of the insulating films 31 and 32 having different refractive indexes similarly to FIG. 7. The insulating film 31 having the large refractive index $n_1$ and the insulating film 32 having the small refractive index $n_2$ are formed on each light emitting device 3 through the planarization film 21.

Figure 12:
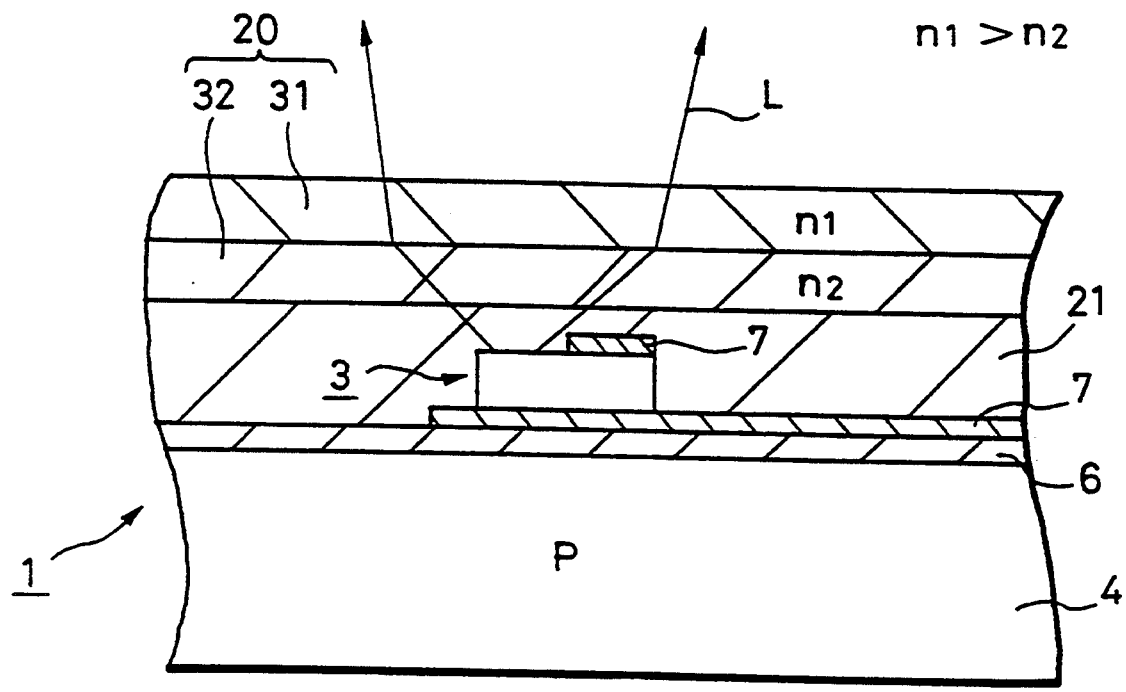
FIG. 12 is a cross-sectional view illustrative of a further example that the light directivity member is formed.

FIG. 12 shows an example of the light directivity member 20 being formed by laminating the insulating films 31 and 32 having different refractive indexes similarly to FIG. 9. The two insulating films 32, 31 thus laminated are formed on each light emitting device 3 through the planarization film 21.

Figure 13:
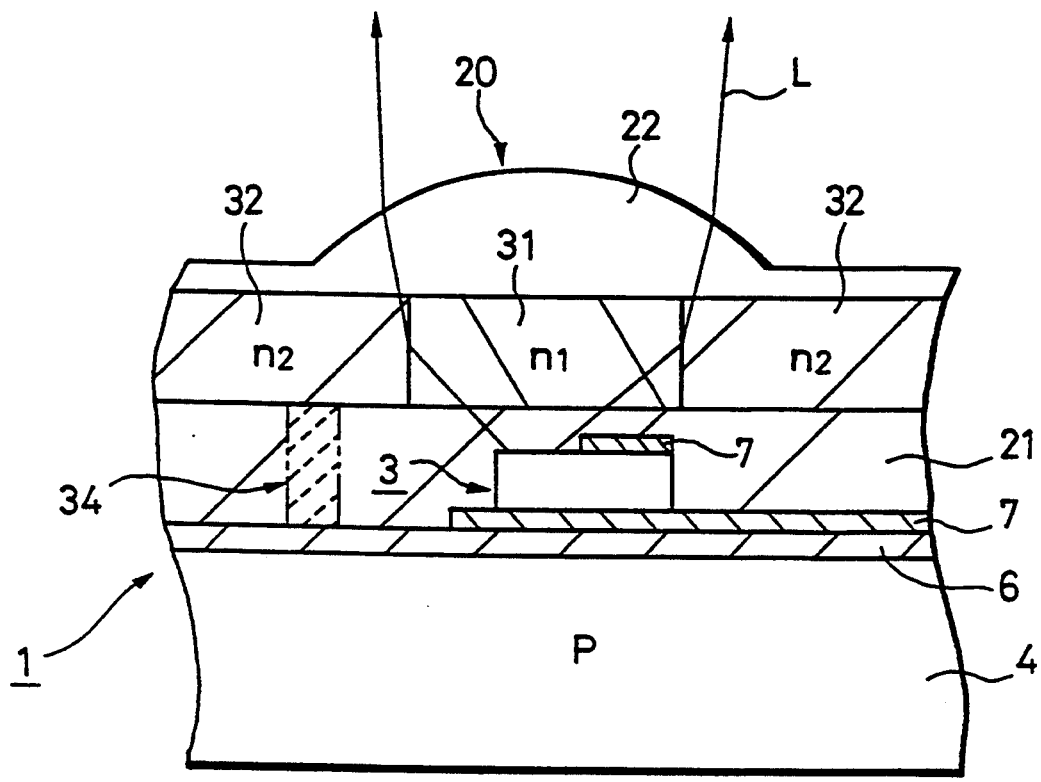
FIG. 13 is a cross-sectional view illustrative of a further example of formation of light directivity member.

FIG. 13 shows an example of the light directivity member 20 being formed by the combination of the insulating films 31 and 32 having different refractive indexes along with the on-chip micro-lens 22.

According to any one of the aforesaid examples shown in FIGS. 10 to 13, similarly as described with reference to FIGS. 5, 6, 7 and 8, the light L from the light emitting device 3 is converged forwardly, whereby the utilization factor of light can be improved and the flare can be avoided.

According to the solid state imaging devices of the present invention, there can be formed a light intercepting section that is used to prevent lights from the light emitting devices 3, 3, . . . , (or 3r. 3b, 3g, . . . ) from being diffused within the semiconductor substrate 4 so that they are not directly introduced into the image section 11. The light intercepting section is formed between the image section 11 and the light emitting devices 3, particularly near the light emitting devices 3.

Figure 14:
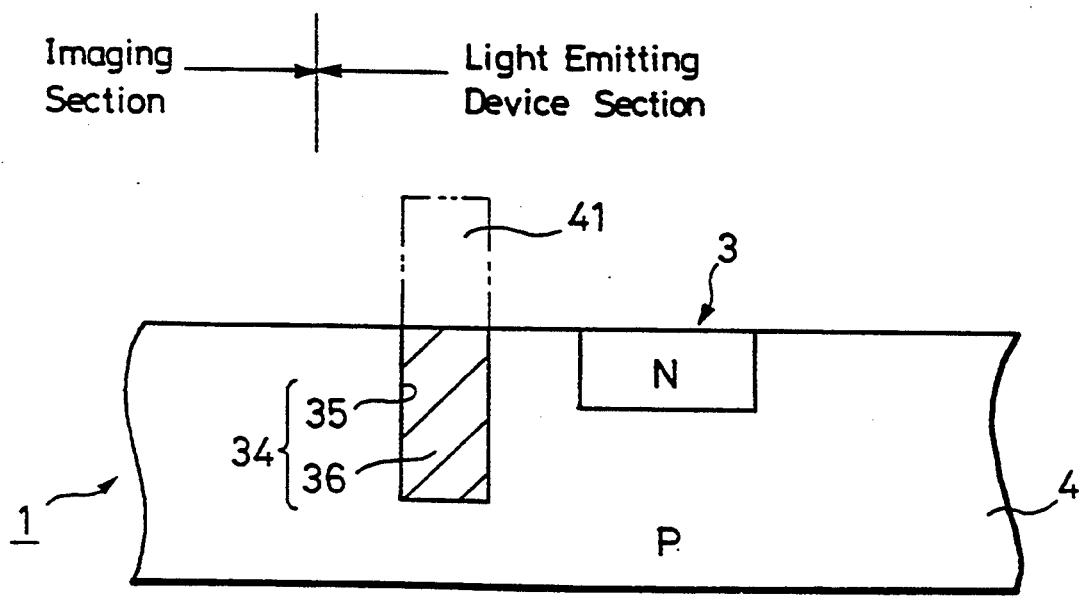
FIG. 14 is a cross-sectional view illustrative of an example of formation of a light intercepting section.

FIG. 14 shows an example wherein there is provided a light intercepting section. In accordance with this embodiment, a vertical groove 35 is formed on the semiconductor substrate 4 at the position between the image section 11 and the light emitting device 3 and corresponding to the nearby portion of the light emitting device 3. Then, a light intercepting section 34 is formed by burying a metal layer 36 such as an Al or the like into the vertical groove 35. The light intercepting section 34 can be commonly formed over the entirety of each light emitting device 3.

According to the structure shown in FIG. 14, the light diffused within the semiconductor substrate 4 from the light emitting device 3 can be prevented from being directly introduced into the image section 11 by the light intercepting section 34 formed of the metal layer 36, thereby preventing the occurrence of smear due to the light diffused within the semiconductor substrate 4.

Figure 15:
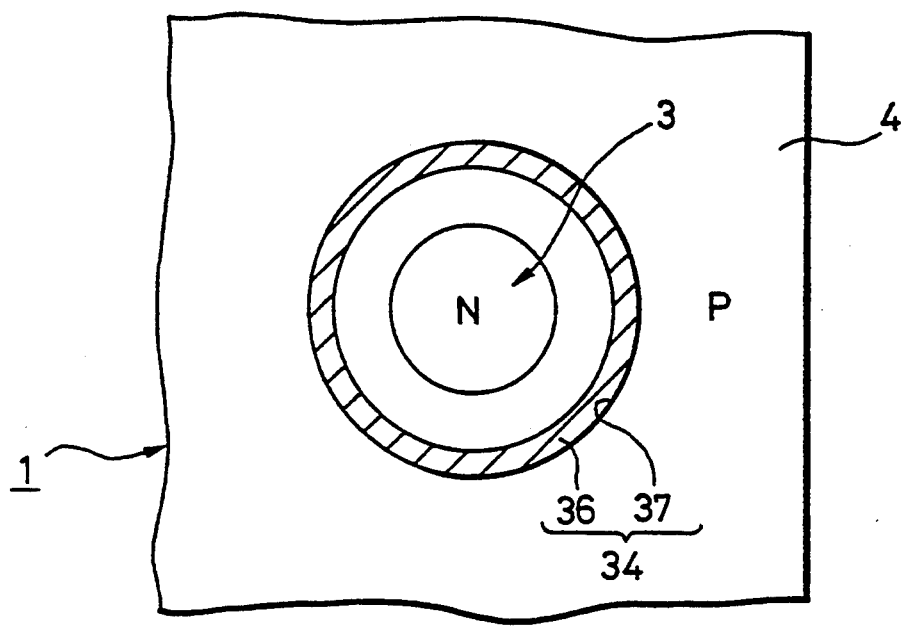
FIG. 15 is a plan view illustrative of other example of formation of a light intercepting section.

FIG. 15 shows another example of the light intercepting section 34. According to this embodiment, from a plan view standpoint, an annular groove 37 is formed on the semiconductor substrate 4 so as to surround each of the light emitting devices 3 and a metal layer 36 such as the Al or the like is embedded into the annular groove 37 to thereby form the light intercepting section 34.

According to this structure, the light from the light emitting device 3 can be prevented from being diffused within the semiconductor substrate 4 so that it can be prevented from being introduced into the image section 11. Also, the light is reflected on the light intercepting section 34, thereby increasing a light emission density.

Figure 16:
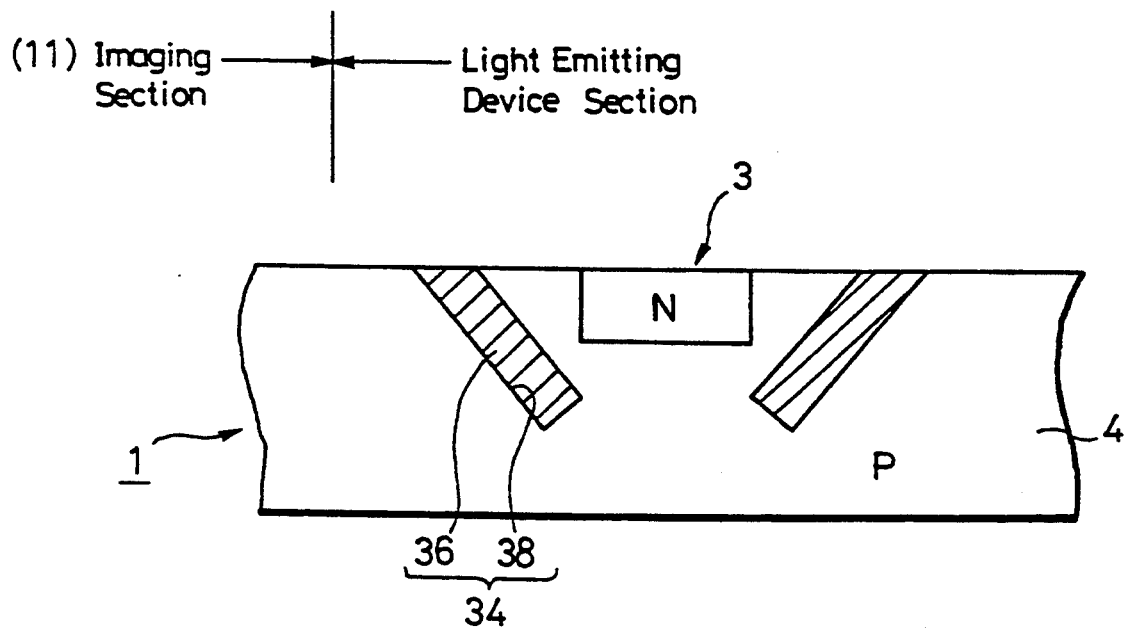
FIG. 16 is a cross-sectional view illustrative of other example of formation of a light intercepting section.

FIG. 16 shows a further example of the light intercepting section 34. In accordance with this embodiment, as shown in FIG. 16, the semiconductor substrate 4 has at its position near the light emitting device 3 an oblique groove 38 extending up to the lower portion of the light emitting device 3. Then, the light intercepting section 34 is formed by embedding the metal layer 36 into the oblique groove 38 by a vapor deposition of Al or selective CVD (chemical vapor deposition) of tungsten or the like, for example.

Figure 17:
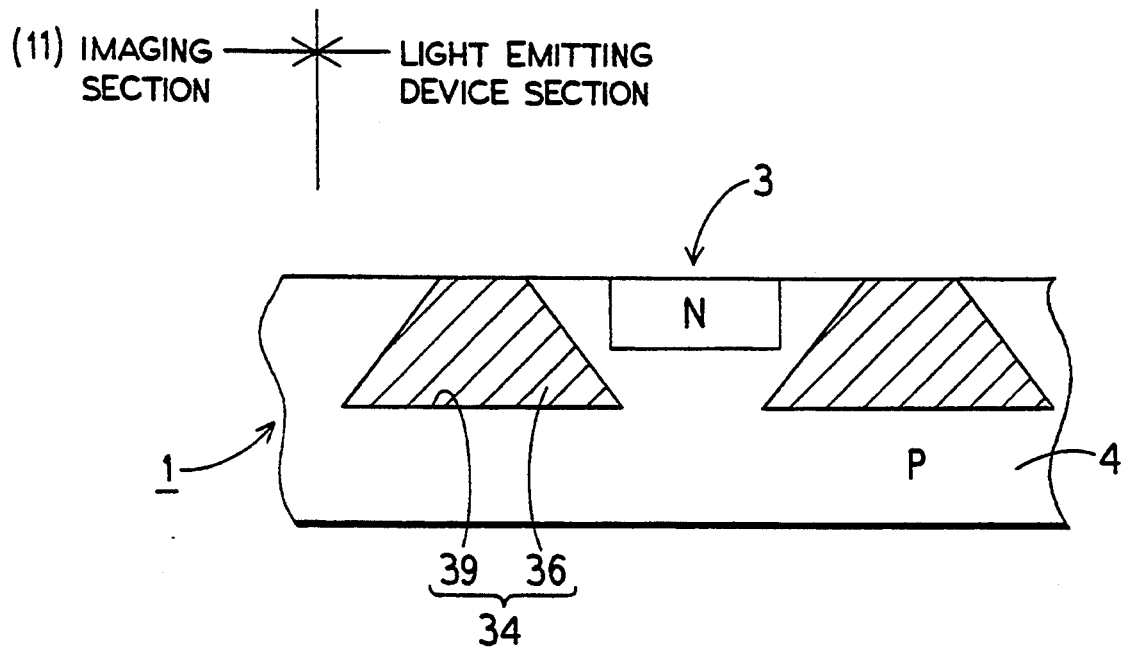
FIG. 17 is a cross-sectional view illustrative of a further example of formation of a light intercepting section.

FIG. 17 shows a further example of the light intercepting section 34. In accordance with this embodiment, as shown in FIG. 17, the semiconductor substrate 4 has at its position near the light emitting device 3 a reverse-mesa type groove 39 extending up to the lower portion of the light emitting device 3. Then, the light intercepting section 34 is formed by embedding the metal layer 36 formed by the selective CVD method of tungsten into the groove 39.

The light intercepting section 34 shown in FIGS. 16 and 17 may be formed on the semiconductor substrate 4 so as to surround each light emitting device 3 or may be formed at both sides of each light emitting device 3. The oblique groove 38 and the reverse-mesa type groove 39 may be formed by selecting a crystal azimuth of the semiconductor substrate.

In accordance with the embodiments shown in FIGS. 16 and 17, since the light intercepting section 34 is extended up to the lower portion of the light emitting device 3, the light from the light emitting device 3 can be more reliably prevented from being introduced into the image section 11. Further, it becomes possible to increase a light emission density.

Figure 18:
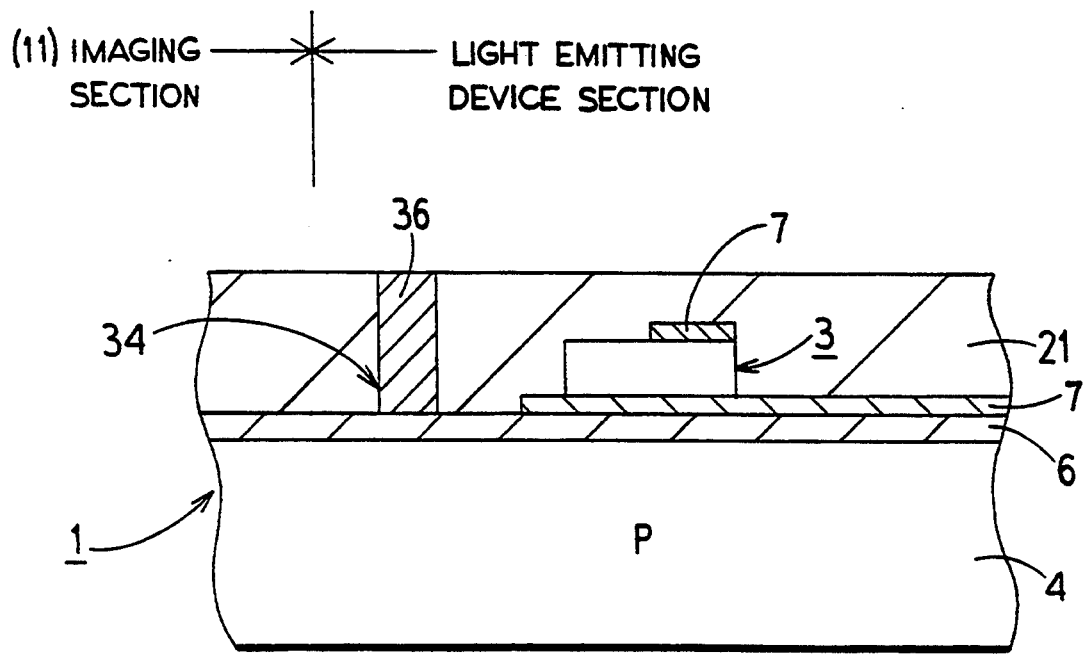
FIG. 18 is a cross-sectional view illustrative of a further example of formation of a light intercepting section.

In the case of the solid state imaging device in which the light emitting device 3 is formed on a different semiconductor substrate from that of the solid state imaging device, as shown in FIG. 18, the light intercepting section 34 formed of the metal layer 36 such as Al or the like can be formed at a position near the light emitting device 3 provided within the planarization film 21 in which the light emitting device 3 is buried. Alternatively, this light intercepting section 34 may be formed so as to surround each of the light emitting devices 3, though not shown.

The above-mentioned light intercepting section 34 may be formed in combination with the light directivity member 20, as shown in FIGS. 6 and 13.

Further, as the light intercepting section 34, as shown by a two-dot chain line in FIG. 14, for example, there may be formed a light intersecting portion 41 that projects outwardly from the substrate in which the light emitting device 3 is formed at the corresponding position between the image section 11 and the light emitting device 3. This light intercepting section 41 may be unitarily formed with the light intercepting section 34 or it may be formed separately.

Since the light intercepting section 41 is provided, for light emitted to the outside from the light emitting device 3, a light in the lateral direction can be prevented from being introduced into the image section 11 and the occurrence of smear due to the light in the lateral direction can be prevented.

The light intercepting section 41 may be formed so as to surround only the image section 11 or the light emitting device 3. Incidentally, although the metal layer 36 is used as the light intercepting sections 34 and 41 of the above-mentioned examples, the light intercepting sections 34, 41 may be formed of a member having a large light absorptance.

Figure 19A:
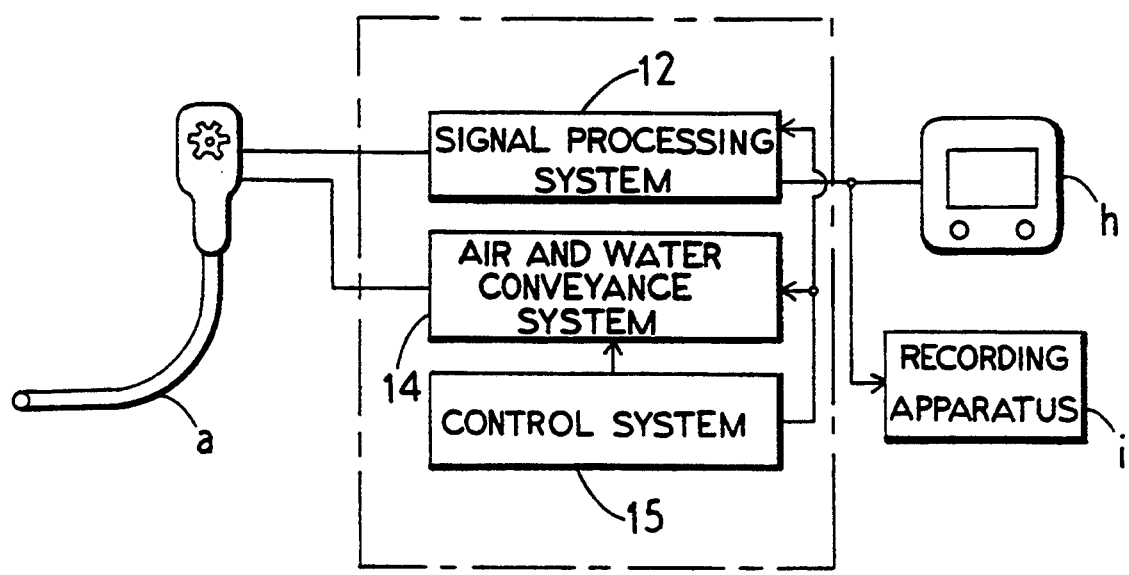
FIG. 19 is a schematic diagram showing an example wherein the solid state imaging device of the present invention is applied to an electro-endoscope.
Figure 19B:
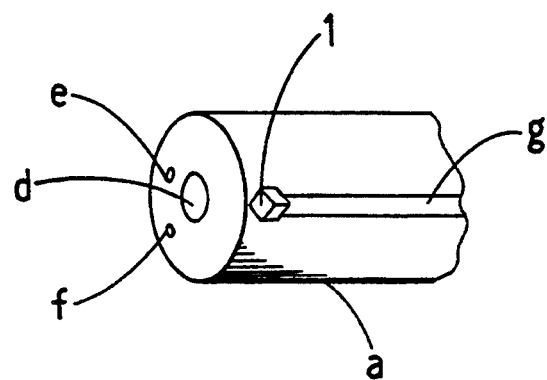

FIG. 19 is a schematic diagram showing an example in which the solid state imaging device of the present invention is applied to the electro-endoscope.

As shown in FIG. 19, there are provided an endoscope scope a and the solid state imaging device 1 of the present invention located at a position behind the top of the scope a. The solid state imaging device 1 receives a source voltage from a signal processing system 12 provided at the outside of the endoscope a and supplies its picked-up image signal to the signal processing system 12.

An objective lens d is disposed ahead of the solid state imaging device 1. A blast outlet e is used to clean smudges on the objective lens d by the jetting of air supplied thereto from an air and water conveyance system 14. A water conveyance outlet f is used to jet water supplied thereto from the air and water conveyance system 14. The solid state imaging device 1 and the signal processing system 12 are coupled via a wiring g. In FIG. 19, reference numeral 15 designates a control system and reference letters h denote a television monitor and i a recording apparatus.

According to the electro-endoscope of the present invention, since the solid state imaging device 1 itself incorporates therein the light emitting device (not shown in FIG. 19 because it is too small), the light source system need not be provided and also the light guide becomes unnecessary. Therefore, the endoscope scope a can be reduced in thickness by the thickness of the unnecessary light guide. Since the light emitting device 3 is of course energized by a power supply voltage to the solid state imaging device supplied thereto as the power supply voltage, it is not necessary to provide a special line in order to transmit a power supply voltage that energizes the light emitting device 3.

The application range of the solid state imaging device of the present invention is not always limited to the electro-endoscope and may be generally applied to those that can pick up an object at a dark place. Furthermore, it is proposed that the solid state imaging device of the present invention is applied to a microscope to thereby reproduce a picked-up image on the television monitor h.

Since the solid state imaging device of the present invention includes the light emitting device, such a light emitting device can be used as the illumination light source and hence the light source need not be independently provided as the separate parts of the solid state imaging device. Therefore, though this solid state imaging device is simple in structure and small in size, this solid state imaging device can pick up an image in a dark place.

Since solid state imaging device of the present invention includes the light emitting device unitarily formed on the surface portion of the semiconductor substrate on which the solid state imaging device is formed, the light emitting device can be manufactured in the manufacturing process of the solid state imaging device, and a process in which the solid state imaging device is assembled onto the light emitting device is not required. Thus, the solid state imaging element having the light emitting device serving as the light source can be made smaller in size and the number of assembly steps can be reduced.

Since the solid state imaging device of the present invention includes the light emitting device bonded to the surface of the semiconductor substrate in which the solid state imaging device is formed, i.e., the light emitting device is formed separately from the solid state imaging device and is bonded to the surface of the solid state imaging device, a light emitting device can be used as the light source whose characteristics cannot be obtained when the semiconductor substrate in which the solid state imaging device is formed is used as the semiconductor substrate. Thus, intensity of light from the light source and a color of light can be selected with increased freedom.

Since the solid state imaging device of the present invention includes a plurality of light emitting devices which emit light of different colors, an illumination light can be provided as a light of white color or a color close to a white color. Hence, an object image can be reproduced in genuine color or a color close to the genuine color.

Since the solid state imaging device of the present invention includes the light intercepting section that prevents the light from the light emitting device from being introduced into the image section, the light emitted from the light emitting device can be prevented from being introduced into the image section. Hence, the occurrence of a smear due to the light from the light emitting device can be avoided.

Since the solid state imaging device of the present invention includes the light directivity member formed on the surface of the light emitting device, the light emitted from the light emitting device is converged forward via the light directivity member. Hence, a utilization factor of light can be improved and the occurrence of flare due to the light from the light emitting device can be avoided.

Since the solid state imaging device of the present invention includes the light directivity member formed of the on-chip micro-lens, such an on-chip micro-lens can be formed at the same time when the on-chip micro-lens on the image section is formed, and also the light directivity section can be formed with ease.

Further, since the solid state imaging device of the present invention includes the light directivity member formed by the combination of films having different refractive indexes, the light directivity member can be formed with ease.

Furthermore, the solid state imaging device of the present invention is used as the electro-endoscope. According to this solid state imaging device, since any one of the aforesaid solid state imaging devices is applied to the electro-endoscope, it is possible to provide a small electro-endoscope having a simple structure. Also, a color of illumination light and an intensity of illumination light can be selected with increased freedom. Furthermore, the illumination light can be made as a light of white color or color close to the white color by the combination of light emitting devices having different colors. Hence, the object image can be reproduced in genuine color or a color close to the genuine color or color suitable when an object is picked up.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid state imaging device comprising:
   at least one light emitting device; light directivity control means provided above said light emitting device for controlling an emitted light so that said emitted light is prevented from being introduced to an image area of said solid state imaging device; and
   said light directivity control means being composed of a plurality of layers, said plurality of layers including a first layer provided above said light emitting device and having a higher index of refraction than that of a second layer which is provided around said first layer.

2. A solid state imaging device, comprising:
   an image area comprising a plurality of image sensors on a surface of a semiconductor body each serving as a pixel, a plurality of vertical signal lines, a horizontal signal line, and an output section;
   an illuminating means for illuminating an object which faces said surface of the semiconductor body and which is sensed by said image area, said illuminating means being provided on said same surface of the semiconductor body at which said image area is provided; and
   said illuminating means being located at least at both opposite sides of said image area.

3. A solid state imaging device according to claim 2 wherein said illuminating means comprises a diode.

4. A solid state imaging device according to claim 2 wherein said illuminating means is provided on said surface of said semiconductor body by use of a layer containing said illuminating means.

5. A solid state imaging device according to claim 2 wherein said illuminating means is adjacent said image area.

6. A solid state imaging device according to claim 2 wherein said illuminating means comprises a plurality of light emitting devices, a first one of said light emitting devices emitting a first light of a color different from a second light emitted by a second one of said light emitting devices.

7. A solid state imaging device according to claim 6 further comprising a third of said light emitting devices emitting a third light of a color different from said first and second lights.

8. A solid state imaging device according to claim 7 wherein said colors of said first, second, and third lights are respectively green, red, and blue.

9. A solid state imaging device according to claim 2 further comprising light intercepting means located between said image area and said illuminating means for preventing a light emitted by said illuminating means from being introduced to said image area.

10. A solid state imaging device according to claim 9 wherein said light intercepting means comprises a trench provided in a semiconductor body and filled with a metallic material.

11. A solid state imaging device according to claim 9 wherein said light intercepting means comprises a projection provided on a semiconductor body.

12. A solid state imaging device according to claim 2 further comprising light directivity control means provided above said illuminating means for controlling an emitted light so that said emitted light is prevented from being introduced to said image area.

13. A solid state imaging device according to claim 12 wherein said light directivity control means comprises a micro lens.

14. A solid state imaging device according to claim 12 wherein said light directivity control means is comprised of a plurality of layers, said plurality of layers including a first layer provided above said light emitting device and having a higher index of refraction than that of a second layer provided around said first layer.

15. A solid state imaging device according to claim 12 wherein said light directivity control means comprises a plurality of layers, said plurality of layers including a first layer provided above said light emitting device and having a lower index of refraction than that of a second layer provided on said first layer.

16. A solid state imaging device according to claim 2 wherein said solid state imaging device comprises an electro-endoscope.

17. A solid state imaging device for obtaining an image of an object, comprising:
 a semiconductor substrate having a solid state CCD imaging array at a surface thereof; and
 a plurality of light emitting diodes at said semiconductor surface at opposite sides of said imaging array for illuminating said object when said object faces toward and is in front of said semiconductor surface.

18. An electro-endoscope solid state imaging device for obtaining an image of an object, comprising:
 a semiconductor substrate having a solid state CCD imaging array at a surface thereof; and
 a plurality of light emitting diodes at said semiconductor surface at opposite sides of said imaging array for illuminating said object when said object faces toward and is in front of said semiconductor surface.

* * * * *